United States Patent
Moon

(10) Patent No.: US 7,782,583 B2
(45) Date of Patent: Aug. 24, 2010

(54) ELECTROSTATIC DISCHARGE PROTECTION DEVICE HAVING LOW JUNCTION CAPACITANCE AND OPERATIONAL VOLTAGE

(75) Inventor: Jung Eon Moon, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 218 days.

(21) Appl. No.: 12/098,709

(22) Filed: Apr. 7, 2008

(65) Prior Publication Data

US 2008/0259512 A1 Oct. 23, 2008

(30) Foreign Application Priority Data

Apr. 20, 2007 (KR) ............... 10-2007-0039015

(51) Int. Cl.
| | |
|---|---|
| H02H 9/00 | (2006.01) |
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |

(52) U.S. Cl. ..................... 361/56; 361/118
(58) Field of Classification Search .............. None
See application file for complete search history.

(56) References Cited

U.S. PATENT DOCUMENTS

| | | | |
|---|---|---|---|
| 6,690,561 B2 * | 2/2004 | Hung et al. ............ 361/111 |
| 6,861,680 B2 * | 3/2005 | Ker et al. .............. 257/199 |
| 7,312,966 B2 * | 12/2007 | Lee ....................... 361/56 |
| 2007/0242400 A1 * | 10/2007 | Choi ..................... 361/56 |

FOREIGN PATENT DOCUMENTS

| | | |
|---|---|---|
| JP | 2007-067095 A | 3/2007 |
| KR | 1020060099464 A | 9/2006 |
| KR | 1020070024014 A | 3/2007 |
| KR | 1020070102229 A | 10/2007 |

OTHER PUBLICATIONS

Shih-Hung Chen, et al; "A New Failure Mechanism on Analog I/O Cell under ND-Mode ESD Stress in Deep-Submicron CMOS Technology", Proceedings of $12^{th}$ IPFA Jun. 27-Jul. 1, 2005 Singapore, pp. 209-212.

* cited by examiner

*Primary Examiner*—Stephen W Jackson
*Assistant Examiner*—Dharti H Patel
(74) *Attorney, Agent, or Firm*—Ladas & Parry LLP

(57) ABSTRACT

An electrostatic discharge protection device includes a power supply line and a ground line. A voltage detection unit detects first and second detection voltages by forming an electrical connection between the power supply line and the ground line in response to alternating current of electrostatic current. A first transfer unit transfers the electrostatic current into the power supply line by forming an electrical connection between the input/output pad and the power supply line in response to the first detection voltage. A second transfer unit transfers the electrostatic current into the ground line by forming an electrical connection between the input/output pad and the ground line in response to the second detection voltage. A discharge unit discharges the electrostatic current flowing into the power supply line or the ground line by forming an electrical connection between the power supply line and the ground line in response to the second detection voltage.

12 Claims, 5 Drawing Sheets

ELECTROSTATIC DISCHARGE PROTECTION DEVICE HAVING LOW JUNCTION CAPACITANCE AND OPERATIONAL VOLTAGE

CROSS-REFERENCE TO RELATED APPLICATIONS

The present application claims priority to Korean patent application number 10-2007-0039015 filed on Apr. 20, 2007, which is incorporated herein by reference in its entirety.

BACKGROUND OF THE INVENTION

The present invention relates to a semiconductor memory device, and more particularly to an electrostatic discharge protection device having a low junction capacitance and operational voltage for protecting an internal circuit from an electrostatic current.

A typical semiconductor memory device includes an electrostatic discharge protection device between an input/output pad and an internal circuit in order to prevent the internal circuit from being influenced by the electrostatic current.

Design trends in the semiconductor devices call for manufacturing semiconductor devices that achieve higher speeds and that are highly integrated. In these high speed, highly intergraded semiconductor devices, a low pin capacitance is required, and the gate oxide of the semiconductor device is very thin. In particular, the pin capacitance may adversely influence the input/output transfer speed and perseverance of the signal, and thus it is necessary to reduce the pin capacitance for high-speed devices.

The pin capacitance makes up more than 50% of the total junction capacitance of a semiconductor device, and a considerable portion of the pin capacitance consists of the parasitic junction capacitance of the electrostatic discharge protection element connected to the input/output pad.

Therefore, the junction capacitance of the electrostatic protection device must be reduced by improving the area suitable for high-speed and highly integrated products, and the operational speed of the electrostatic protection device must be increased in order to protect the thin gate oxide layer of the internal circuit device.

Referring to FIG. 1, a conventional electrostatic discharge protection device includes a P-type diode 104 connected between the input/output pad 100 and the power supply voltage line VCC 102, an N-type diode 105 connected between the input/output pad 100 and the ground voltage line VSS 103, a CDM transistor protection resistor 106 connected between the input/output pad 100 and the internal circuit 108, a CDM transistor 107 connected between the internal circuit 108 and the ground voltage line VSS 103, and a power clamp 109 connected between the power supply voltage line VCC 102 and the ground voltage line VSS 103.

Referring to FIG. 2A, the P-type diode 104 has a P-type impurity region 202 and an N-type impurity region 204 formed within an N-well region 201, and an element isolation layer 203 interposed between the P-type impurity region 202 and the N-type impurity region 204. The P-type impurity region 202 is connected to the input/output pad 100, and the N-type impurity region 204 is connected to the power supply voltage line VCC 102.

Referring to FIG. 2B, the N-type diode 105 has an N-type impurity region 212 and a P-type impurity region 214 formed within a P-well region 211, and an element isolation layer 213 interposed between the N-type impurity region 212 and the P-type impurity region 214. The N-type impurity region 212 is connected to the input/output pad 100, and the P-type impurity region 214 is connected to the ground voltage line VSS 103.

Further, as shown in FIG. 3, an N-type guard ring 220 is disposed adjacent to the N-type diode 105 to prevent latch-up between the input/output pad 100 and adjacent circuits. More specifically, the N-type guard ring 220 has an N-type impurity region 224 formed within the N-well region 222, and the N-type impurity region 224 is connected to an external voltage line VDD 226. Reference numeral 215 is an element isolation layer that separates the P-type impurity region 214 from the N-type impurity region 224.

Although the conventional electrostatic discharge protection device has a small junction region when using the P-type diode 104 and the N-type diode 105, a problem occurs, in that the conventional electrostatic discharge protection device cannot effectively protect the gate oxide of the internal circuit 108 if the operational speed of the power clamp 109 is low.

Further, the conventional electrostatic discharge protection device discharges negative electrostatic currents flowing from the input/output pad 100 from the power supply voltage pad VCC 102, through the power clamp 109 and then the N-type diode 105, to the input/output pad 100. In this case, if the power clamp 109 does not operate rapidly, a parasitic NPN bipolar transistor T1 present between the N-type guard ring 220 and the N-type diode 105 operates as shown in FIG. 3. As a result, an undesirable electrostatic discharge path is formed. Therefore, failure can occur between the vulnerable N-type guard ring 220 and the P-type impurity region 214.

SUMMARY OF THE INVENTION

There is provided an electrostatic discharge protection device having a low junction capacitance and a low operational voltage.

Further, there is provided an electrostatic discharge protection device that prevents failure caused by an electrostatic discharge path formed by a vulnerable parasitic bipolar operation.

The electrostatic discharge protection device for protecting an internal circuit from an electrostatic current flowing into an input/output pad comprises a voltage detection unit detecting a first detection voltage and a second detection voltage by electrically connecting a power supply voltage line to a ground voltage line in response to an alternating current component of the electrostatic current flowing into the input/output pad; a first transfer unit transferring the electrostatic current into the power supply voltage line by electrically connecting the input/output pad to the power supply voltage line in response to the first detection voltage; a second transfer unit transferring the electrostatic current into the ground voltage line by electrically connecting the input/output pad to the ground voltage line in response to the second detection voltage; and a discharge unit discharging the electrostatic current flowed into the power supply voltage line or the ground voltage line by electrically connecting the power supply voltage line to the ground voltage line in response to the second detection voltage.

Preferably, the voltage detection unit comprises a RC circuit connected between the power supply voltage line and the ground voltage line.

According to one embodiment, the RC circuit comprises a first resistor connected between the power supply voltage line and a first node to output the first detection voltage; a second resistor connected between the ground voltage line and a second node to output the second detection voltage; and a capacitor connected between the first node and the second node.

According to other embodiment, the RC circuit comprises a first resistor connected between the power supply voltage line and the first node to output the first detection voltage; a second resistor connected between the ground voltage line and the second node to output the second detection voltage; and a plurality of diodes connected in series between the first node and the second node.

Herein, the number of the plurality of diodes is selecting such that an operational voltage of the plurality of diodes is adjusted to be greater than that of the power supply voltage line. Each of the diodes in the plurality of diodes has an anode connected in the direction of the first resistor and a cathode connected in the direction of the second resistor.

The first transfer unit comprises a MOS P type diode connected between the input/output pad and the power supply voltage line, and the first detection voltage is applied to the gate of the MOS P type diode.

Herein, the MOS P type diode comprises an N-well region; a first P-type impurity region formed within the N-well region and connected to the input/output pad; an N-type impurity region formed at a predetermined distance from the first P-type impurity region and connected to the power supply voltage line; a second P-type impurity region formed at a predetermined distance from the first P-type impurity region and adjacent to the N-type impurity region; and a gate formed over the N-well region, with the first detection voltage being applied to the gate.

The second transfer unit comprises a MOS N type diode connected between the input/output pad and the ground voltage line, and a second detection voltage is applied to the gate of the MOS N type diode.

Herein, the MOS N type diode comprises a P-well region; a first N-type impurity region formed within the P-well region and connected to the input/output pad; a P-type impurity region formed at a predetermined distance from the first N-type impurity region and connected to the ground voltage line; a second N-type impurity region formed at a predetermined distance from the first N-type impurity region and adjacent to the P-type impurity region; and a gate formed over the P-well region, with the second detection voltage being applied to the gate.

Preferably, the discharge unit comprises a MOS transistor connected between the power supply voltage line and the ground voltage line, and the second detection voltage is applied to the gate of the MOS transistor. The MOS transistor comprises a GCNMOS transistor.

DESCRIPTION OF SPECIFIC EMBODIMENTS

Hereinafter, preferred embodiments of the present invention will be described in detail with reference to the accompanying drawings.

The present invention relates to an electrostatic discharge protection device having a low junction capacitance and a low operational voltage.

Figure 4:
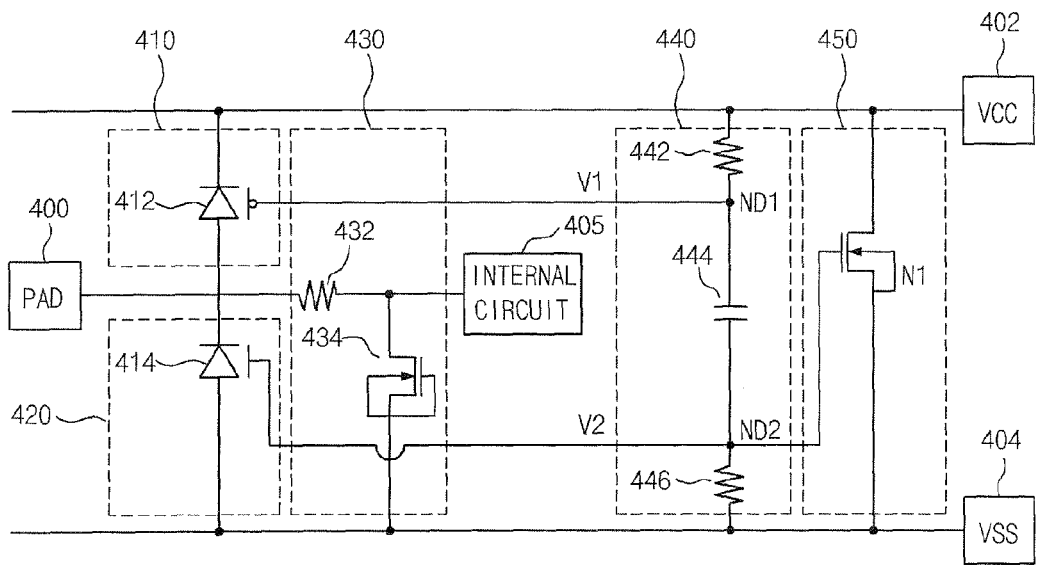
FIG. 4 is a circuit diagram showing an electrostatic discharge protection device according to an embodiment of the present invention.

Referring to FIG. 4, the electrostatic discharge protection device according to an embodiment of the present invention includes transfer units 410 and 420, a CDM unit 430, a voltage detection unit 440, and a discharge unit 450.

The transfer unit 410 can be implemented with a PMOS-P type diode 412 connected between the input/output pad 400 and the power supply voltage line VCC 402 to transfer electrostatic current flowing into the input/output pad 400 to the power supply voltage line VCC 402.

The transfer unit 420 can be implemented with a NMOS-N type diode 414 connected between an input/output pad 400 and the ground voltage line VSS 404 to transfer the electrostatic current flowing into the input/output pad 400 to the ground voltage line VSS 404.

The CDM unit 430 can be implemented with a CDM transistor protection resistor 432 connected between the input/output pad 400 and the internal circuit 405, and a CDM transistor 434 connected between the internal circuit 405 and the ground voltage line VSS 404.

The voltage detection unit 440 is implemented with an RC circuit connected between the power supply voltage line VCC 402 and the ground voltage line VSS 404 to detect detection voltages V1 and V2 in response to the alternating current component of the electrostatic current. More specifically, the voltage detection unit 440 is implemented with a resistor 442 connected between the power supply voltage line VCC 402 and a node ND1 to output a first detection voltage V1, a capacitor 444 connected between the node ND1 and node ND2 to pass the alternating current, and a resistor 446 connected between the node ND2 and the ground voltage line VSS 404 to output a second detection voltage V2.

Herein, the first detection voltage V1 is applied to the gate of the PMOS-P type diode 412 to reduce the reverse breakdown voltage of the PMOS-P type diode 412. The second detection voltage V2 is applied to the gate of the NMOS-N type diode 414 to reduce the operational voltage of the NMOS-N type diode 414.

The discharge unit 450 is implemented with an NMOS transistor N1 connected between the power supply voltage line VCC 402 and the ground voltage line VSS 404. The NMOS transistor N1 transfers electrostatic current flowing into the power supply voltage line VCC 402 or the ground voltage line VSS 404 to the opposite voltage line. The NMOS transistor performs this transfer forming an electrical connection between the power supply voltage line VCC 402 with the ground voltage line VSS 404 in response to the second detection voltage V2. The NMOS transistor N1 can be implemented with a gate coupled NMOS (GCNMOS), and the second detection voltage V2 is applied to the gate of the NMOS transistor N1.

Figure 5A:
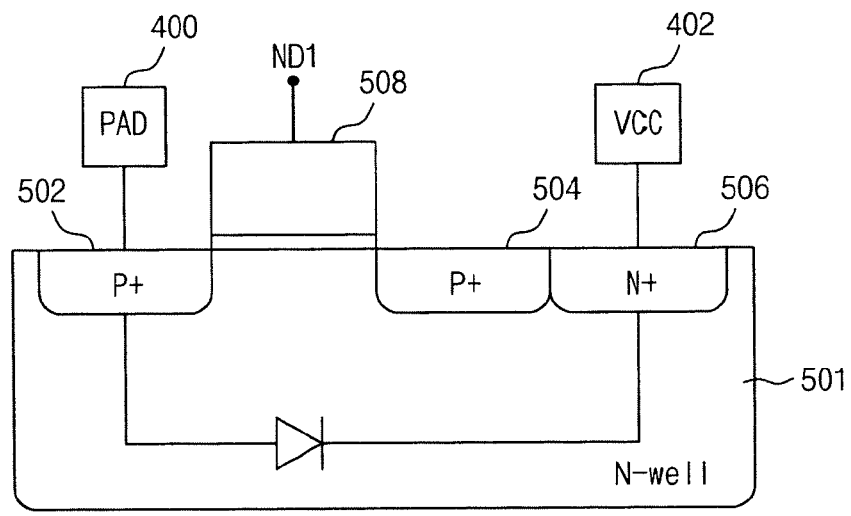
FIG. 5a is a cross-sectional view showing the PMOS-P type diode of FIG. 4.

Referring to FIG. 5A, the PMOS-P type diode 412 has a P-type impurity region 502 connected to the input/output pad, and an N-type impurity region 506 separated from the P-type impurity region 502 and connected to the power supply voltage VCC 402. The P-type impurity region 502 and the N-type impurity region 506 are formed within the N-well region 501 to form a P-type diode. A P-type impurity region 504 is formed at a predetermined distance from the P-type impurity region 502 and is adjacent to the N-type impurity region 506. A gate 508 is formed between the P-type impurity regions 502 and 504 to form a PMOS. As shown in FIG. 5A, the first detection voltage V1 (at ND1) is applied to the gate 508.

Figure 5B:
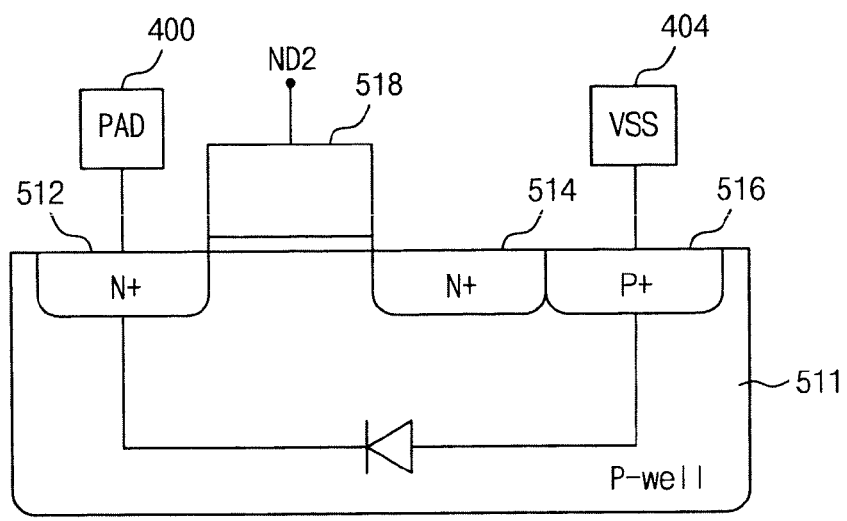
FIG. 5b is a cross-sectional view showing the NMOS-N type diode of FIG. 4.

Referring to FIG. 5B, the NMOS-N type diode 414 has an N-type impurity region 512 connected to the input/output pad 400, and a P-type impurity region 516 separated from the N-type impurity region 512 and connected to the ground voltage line VSS 404. The N-type impurity region 512 and the P-type impurity region 516 are formed within the P-well region 511 to form an N-type diode. An N-type impurity region 514 is formed at a predetermined distance from the N-type impurity region 512, and is adjacent to the P-type impurity region 516. A gate 518 is formed between the N-type impurity regions 512 and 514 to form a NMOS. As shown in FIG. 5B, the second detection voltage V2 (at ND2) is applied to the gate 518.

An operation of the electrostatic discharge protection device according to the above embodiment of the present invention will be hereinafter described.

When a negative electrostatic discharge is generated the power supply voltage line VCC 402 is used as a ground. When the negative electrostatic discharge is generated from the input/output pad 400, an initial electrostatic current having an alternating current characteristic is discharged from the voltage detection unit 440 via the NMOS-N diode 414 to the input/output pad 400. At this time, the NMOS-N type diode is in forward operation.

During the course of discharging the electrostatic current, voltage drops occur in each of the resistor terminals 442 and 446 of the voltage detection unit 440, and the voltage drop caused by the resistor 446 connected to the ground voltage line VSS 404 is applied simultaneously to the gate of the NMOS-N type diode 414 and the gate of the NMOS transistor N1. The voltage drop caused by the resistor 446 is the second detection voltage V2. If the second detection voltage V2 is greater than the threshold voltage of the NMOS transistor N1, a channel is generated and the NMOS transistor N1 operates at a high speed.

The voltage drop caused by the resistor 442 connected to the power supply voltage line VCC 402 is applied to the gate of the PMOS-P type diode. The voltage drop caused by the resistor 442 is the first detection voltage V1. If the first detection voltage V1 is greater than the threshold voltage of the PMOS-P type diode, a channel is generated and the reverse breakdown of the junction between the N-type impurity region 506 connected to the power supply voltage line VCC 402 and the P-type impurity region 504 is rapidly induced.

In other words, when the negative electrostaticity is generated in the input/output pad 400, at first, the electrostatic discharge protection device discharges the negative electrostaticity from the power supply voltage line VCC 402, through a discharge unit 450 consisted of GCNMOS transistor N1, then to the NMOS-N type diode 414, and finally to the input/output pad 400. Next, if the voltage between the power supply voltage line VCC 402 and the input/output pad 400 is increased by the electrostatic current, the PMOS-P type diode 412 is caused to be in reverse operation before the parasitic NPN bipolar is generated between the N-type guard ring (not shown) and the NMOS-N type diode 414 wherein the undesirable electrostatic discharge path is formed, and thereby failure due to the vulnerable parasitic NPN bipolar operation is prevented.

Figure 6:
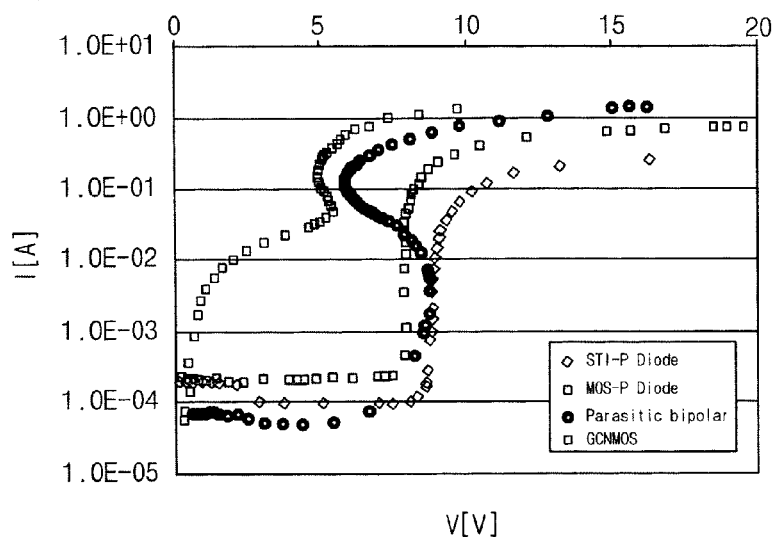
FIG. 6 is a waveform diagram comparing the operational voltages and the operational speeds for each element of the electrostatic discharge protection device via a simulator.

FIG. 6 is a waveform diagram comparing the operational voltages and operational speeds for devices comprising the electrostatic protection device using a transmission line pulse (TLP) simulation.

Referring to FIG. 6, in the electrostatic discharge protection device according to an embodiment of the present invention, the discharge unit 450 connected to the voltage detection unit 440 operates at about 5.4V at the lowest operational voltage. It can be appreciated that the reverse operational voltage of the PMOS-P type diode 412 is about 7.5V, which is lower than the about 8.7V of the parasitic NPN bipolar operational voltage of the NMOS-N type diode 414. It is also lower than the about 8.5V which is a reverse operational voltage of the P-type diode (104 in FIG. 1) of the conventional electrostatic discharge protection device shown in FIG. 1.

Figure 1:
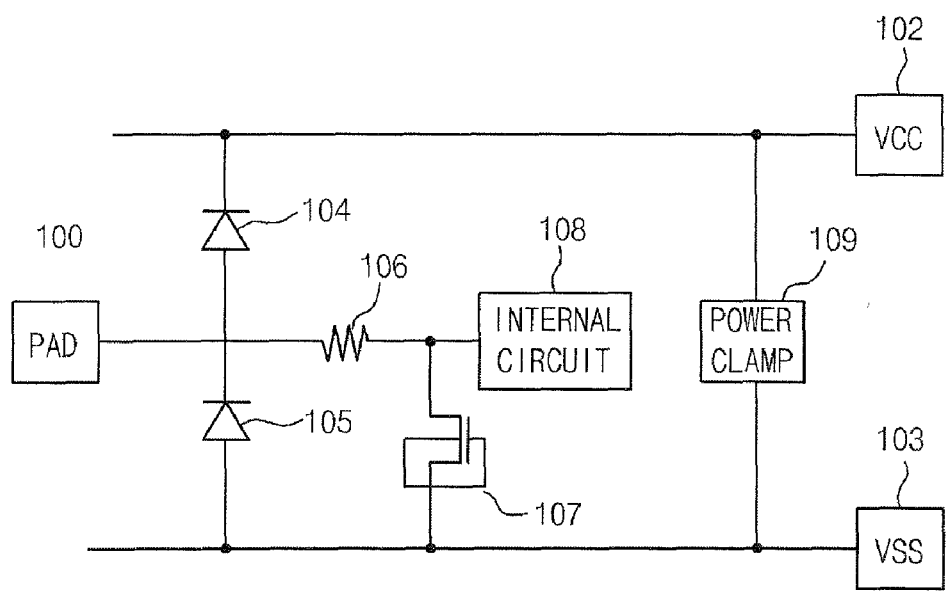
FIG. 1 is a circuit diagram showing a conventional electrostatic discharge protection device.
Figure 2A:
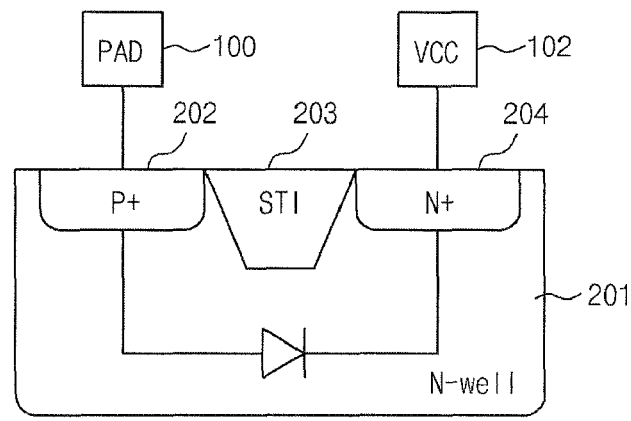
FIG. 2a is a cross-sectional view showing the P-type diode of FIG. 1.
Figure 2B:
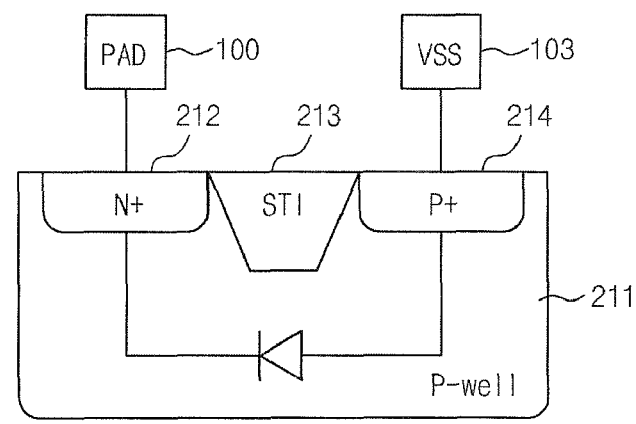
FIG. 2b is a cross-sectional view showing the N-type diode of FIG. 1.
Figure 3:
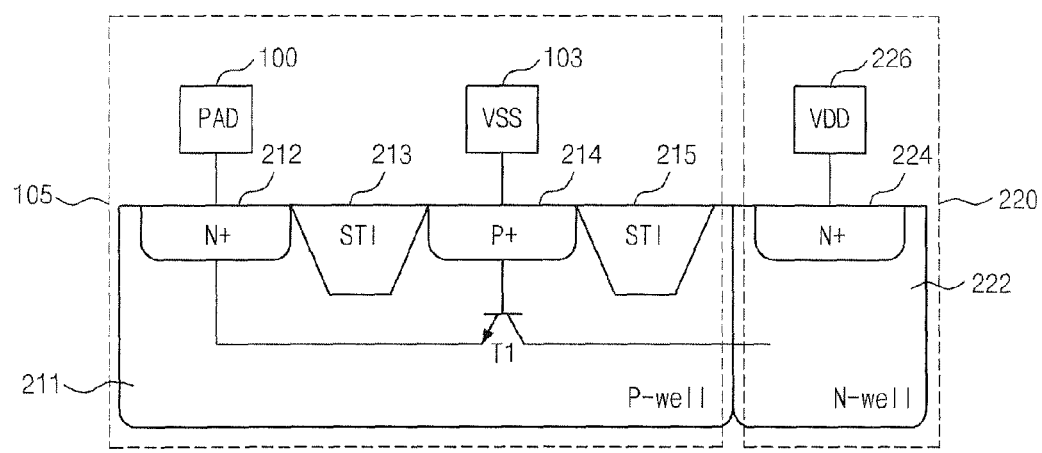
FIG. 3 is a cross-sectional view showing the N-type diode of FIG. 2b and an adjacent guard ring.

In the conventional electrostatic discharge protection device shown in FIG. 1, the reverse operational voltage of the P-type diode (104 of FIG. 1) is 8.5V, which is nearly the same as the about 8.7V of the operational voltage of the parasitic NPN bipolar operational voltage, and therefore there is a high probability of failure occurrence if the power clamp (109 of FIG. 1) does not operate rapidly, and thus large amounts of the electrostatic current is kept from being discharged before the parasitic NPN bipolar operates.

Figure 7:
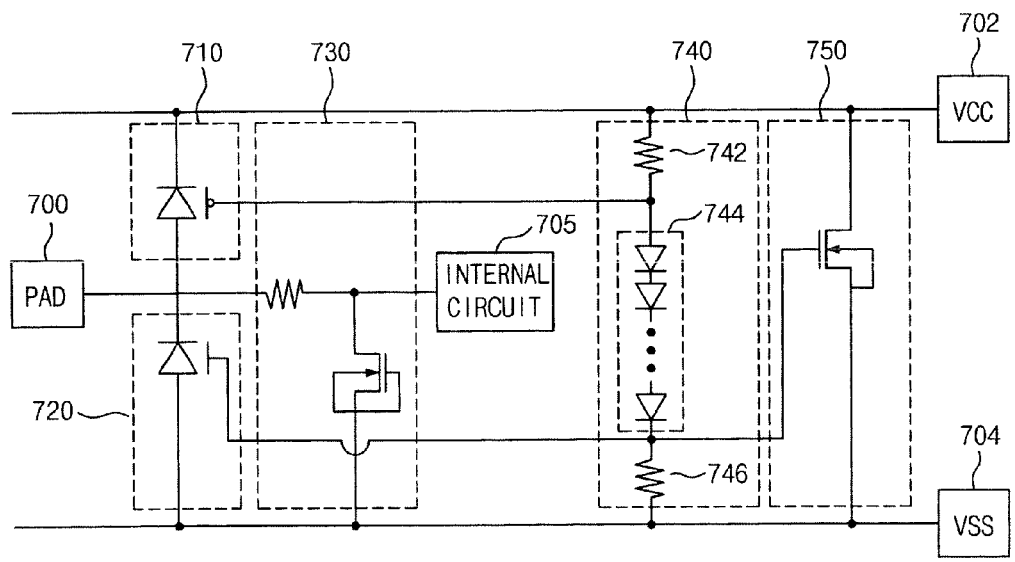
FIG. 7 is a circuit diagram showing an electrostatic discharge protection device according to another embodiment of the present invention.

Referring to FIG. 7, the electrostatic discharge protection device according to another embodiment of the present invention includes transfer units 710 and 720, a CDM unit 730, a voltage detection unit 740, and a discharge unit 750.

Herein, the transfer units 710 and 720, the CDM unit 730, and the discharge unit 750 have the same structure and operation as the transfer units 410 and 420, the CDM unit 430 and the discharge unit 450 of the electrostatic discharge protection circuit shown in FIG. 4.

The operation of the voltage detection unit 740 of FIG. 7 is the same as that of the voltage detection unit 440 of FIG. 4. In the voltage detection unit 740 diodes 744 are connected in series between the resistors 742 and 746 instead of the capacitor (444 of FIG. 4). Preferably the number of diodes is adjusted to make the total operational voltage of the diodes greater than the operational voltage of the power supply VCC.

The electrostatic discharge protection device according to the present invention eliminates the failure generated by the vulnerable parasitic bipolar operation, when the electrostatic discharge protection device of the present invention provides the MOS type diode and applies the voltage drop detected by the RC circuit.

Further, according to the present invention, it is possible to provide an electrostatic discharge protection device suitable for high-speed products by applying the voltage drop detected by the RC circuit to the power clamp.

Further, according to the present invention, it is possible to provide an electrostatic discharge protection device suitable for high-integrated product while preventing an increase in capacitance by mounting the MOS type diode.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An electrostatic discharge protection device having a power supply voltage line and a ground voltage line and protecting an internal circuit from an electrostatic current flowing into an input/output pad, comprising:

a voltage detection unit detecting a first detection voltage and a second detection voltage by forming an electrical connection between the power supply voltage line and the ground voltage line in response to an alternating current component of the electrostatic current;

a first transfer unit transferring the electrostatic current into the power supply voltage line by forming an electrical connection between the input/output pad and the power supply voltage line in response to the first detection voltage;

a second transfer unit transferring the electrostatic current into the ground voltage line by forming an electrical connection between the input/output pad and the ground voltage line in response to the second detection voltage; and a discharge unit discharging the electrostatic current flowing into the power supply voltage line or the ground voltage line by forming an electrical connection between the power supply voltage line and the ground voltage line in response to the second detection voltage.

2. The electrostatic discharge protection device as set forth in claim 1, wherein the voltage detection unit comprises an RC circuit connected between the power supply voltage line and the ground voltage line.

3. The electrostatic discharge protection device as set forth in claim 2, wherein the RC circuit comprises:

a first resistor connected between the power supply voltage line and a first node to output the first detection voltage;

a second resistor connected between the ground voltage line and a second node to output the second detection voltage; and a capacitor connected between the first node and the second node.

4. The electrostatic discharge protection device as set forth in claim 2, wherein the RC circuit comprises:

a first resistor connected between the power supply voltage line and a first node to output the first detection voltage;

a second resistor connected between the ground voltage line and a second node to output the second detection voltage; and a plurality of diodes connected in series between the first node and the second node.

5. The electrostatic discharge protection device as set forth in claim 4, wherein the number of diodes in the plurality of diodes is selected such that an operational voltage of the plurality of diodes is greater than that of the power supply voltage line.

6. The electrostatic discharge protection device as set forth in claim 4, wherein each of the plurality of diodes has an anode connected in the direction of the first resistor and a cathode connected in the direction of the second resistor.

7. The electrostatic discharge protection device as set forth in claim 1, wherein the first transfer unit comprises a MOS P type diode connected between the input/output pad and the power supply voltage line, wherein the first detection voltage is applied to a gate of the MOS P type diode.

8. The electrostatic discharge protection device as set forth in claim 7, wherein the MOS P type diode comprises:

an N-well region;

a first P-type impurity region formed in the N-well region and connected to the input/output pad;

an N-type impurity region formed at a predetermined distance from the first P-type impurity region and connected to the power supply voltage line; and a second P-type impurity region formed at a predetermined distance from the first P-type impurity region and adjacent to the N-type impurity region, wherein the gate having the first detection voltage applied thereto is formed over the N-well region.

9. The electrostatic discharge protection device as set forth in claim 1, wherein the second transfer unit comprises a MOS N type diode connected between the input/output pad and the ground voltage line, wherein the second detection voltage is applied to a gate of the MOS P type diode.

10. The electrostatic discharge protection device as set forth in claim 9, wherein the MOS type N diode comprises:

a P-well region;

a first N-type impurity region formed in the P-well region and connected to the input/output pad;

a P-type impurity region formed at a predetermined distance from the first N-type impurity region and connected to the ground voltage line; and a second N-type impurity region formed at a predetermined distance from the first N-type impurity region and adjacent to the P-type impurity region, wherein the gate having the second detection voltage applied thereto is formed over the P-well region.

11. The electrostatic discharge protection device as set forth in claim 1, wherein the discharge unit comprises a MOS transistor connected between the power supply voltage line and the ground voltage line, and wherein the second detection voltage is applied to a gate of the MOS transistor.

12. The electrostatic discharge protection device as set forth in claim 11, wherein the MOS transistor comprises a GCNMOS transistor.

* * * * *